(12) United States Patent
Ikarashi et al.

(10) Patent No.: US 11,228,301 B2
(45) Date of Patent: Jan. 18, 2022

(54) MULTIPLEXER, RADIO-FREQUENCY MODULE, AND COMMUNICATION DEVICE

(71) Applicant: Murata Manufacturing Co., Ltd., Kyoto (JP)

(72) Inventors: Kazuhiro Ikarashi, Kyoto (JP); Hiroyuki Nagamori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 29 days.

(21) Appl. No.: 16/817,047

(22) Filed: Mar. 12, 2020

(65) Prior Publication Data

US 2020/0295736 A1  Sep. 17, 2020

(30) Foreign Application Priority Data

Mar. 13, 2019 (JP) .............................. JP2019-046419

(51) Int. Cl.
*H03H 9/70* (2006.01)
*H03F 3/68* (2006.01)
*H03H 9/05* (2006.01)
*H03H 9/52* (2006.01)
*H04B 1/40* (2015.01)

(52) U.S. Cl.
CPC ................ *H03H 9/70* (2013.01); *H03F 3/68* (2013.01); *H03H 9/0538* (2013.01); *H03H 9/52* (2013.01); *H03F 2200/165* (2013.01); *H03F 2200/171* (2013.01); *H03F 2200/451* (2013.01); *H04B 1/40* (2013.01)

(58) Field of Classification Search
CPC .......... H03H 9/70; H03H 9/0538; H03H 9/52; H03F 3/68; H03F 2200/165; H03F 2200/171; H03F 2200/451; H04B 1/40
USPC .......................................... 333/193–196, 133
See application file for complete search history.

(56) References Cited

U.S. PATENT DOCUMENTS

| | | | |
|---|---|---|---|
| 2012/0286895 A1* | 11/2012 | Hara .................... | H03H 9/6483 333/133 |
| 2015/0188512 A1 | 7/2015 | Michigami | |
| 2015/0295697 A1 | 10/2015 | Kawachi et al. | |
| 2017/0294896 A1* | 10/2017 | Nosaka .................... | H03H 9/64 |

FOREIGN PATENT DOCUMENTS

| | | | |
|---|---|---|---|
| JP | 2010-192974 A | | 9/2010 |
| JP | 2010192974 A | * | 9/2010 |
| JP | 2015-201808 A | | 11/2015 |
| WO | 2014/050219 A1 | | 4/2014 |

\* cited by examiner

*Primary Examiner* — Hafizur Rahman

(74) *Attorney, Agent, or Firm* — Pearne & Gordon LLP

(57) ABSTRACT

Provided is a multiplexer that includes a first filter (first transmission filter), a second filter (second reception filter), a third filter (third reception filter), a first inductor, and a second inductor. The first inductor is connected in series with one parallel arm resonator (second parallel arm resonator) of the first filter between the one parallel arm resonator and ground. The second inductor is connected in series with another parallel arm resonator (third parallel arm resonator) of the first filter between the other parallel arm resonator and ground. The first inductor and the second inductor have the same winding direction as each other from the first filter side toward the ground side thereof.

11 Claims, 7 Drawing Sheets

MULTIPLEXER, RADIO-FREQUENCY MODULE, AND COMMUNICATION DEVICE

This application claims priority from Japanese Patent Application No. 2019-046419 filed on Mar. 13, 2019. The content of this application is incorporated herein by reference in its entirety.

BACKGROUND

The present disclosure generally relates to a multiplexer, a radio-frequency module, and a communication device. The present disclosure more specifically relates to a multiplexer that can handle simultaneous use of a plurality of different communications, a radio-frequency module that includes the multiplexer, and a communication device that includes the radio-frequency module.

In the related art, multiplexers that can support simultaneous use of a plurality of different communications are known (for example, refer to Japanese Unexamined Patent Application Publication No. 2015-201808).

In the multiplexer disclosed in Japanese Unexamined Patent Application Publication No. 2015-201808, transmission in Band 1 and reception in Band 3 can be simultaneously performed and transmission in Band 1 and reception in Band 32 can be simultaneously performed via carrier aggregation (CA) in which signals of a plurality of frequency bands are simultaneously transmitted and received. The multiplexer disclosed in Japanese Unexamined Patent Application Publication No. 2015-201808 bundles a plurality of carriers or channels together.

In the multiplexer of the related art disclosed in Japanese Unexamined Patent Application Publication No. 2015-201808, there might be insufficient attenuation in a Band 3 (second communication band) reception band in a Band 1 (first communication band) transmission filter (first filter). Similarly, there might be insufficient attenuation in a Band (third communication band) reception band in the Band 1 transmission filter.

BRIEF SUMMARY

The present disclosure provides a multiplexer that can perform attenuation in a second communication band and a third communication band in a first filter that allows a first communication signal of a first communication band to pass therethrough, and to provide a radio-frequency module, and a communication device.

A multiplexer according to an embodiment of the present disclosure includes a common terminal, a first filter, a second filter, a third filter, a first inductor, and a second inductor. The first filter is a filter that can be electrically connected to the common terminal and that allows a first communication signal of a first communication band to pass therethrough. The first filter is a ladder filter that includes a plurality of parallel arm resonators. The second filter can be electrically connected to the common terminal and allows a second communication signal of a second communication band, which is lower than the first communication band, to pass therethrough. The third filter can be electrically connected to the common terminal and allows a third communication signal of a third communication band, which is lower than the second communication band, to pass therethrough. The first inductor is connected in series with one parallel arm resonator, among the plurality of parallel arm resonators of the first filter, between the one parallel arm resonator and ground. The second inductor is connected in series with another parallel arm resonator, among the plurality of parallel arm resonators of the first filter, between the other parallel arm resonator and ground. The first inductor and the second inductor have identical winding directions from a first filter side to a ground side thereof.

A radio-frequency module according to an embodiment of the present disclosure includes the above-described multiplexer, a first amplifier, a second amplifier, and a third amplifier. The first amplifier is connected to the first filter. The second amplifier is connected to the second filter. The third amplifier is connected to the third filter.

A communication device according to an embodiment of the present disclosure includes the above-described radio-frequency module and a signal processing circuit. The signal processing circuit processes the first communication signal, the second communication signal, and the third communication signal.

According to the multiplexer, radio-frequency module, and communication device of the embodiments of the present disclosure, attenuation can be performed in a second communication band and a third communication band in a first filter that allows a first communication signal of a first communication band to pass therethrough.

Other features, elements, characteristics and advantages of the present disclosure will become more apparent from the following detailed description of embodiments of the present disclosure with reference to the attached drawings.

DETAILED DESCRIPTION

Figure 1:
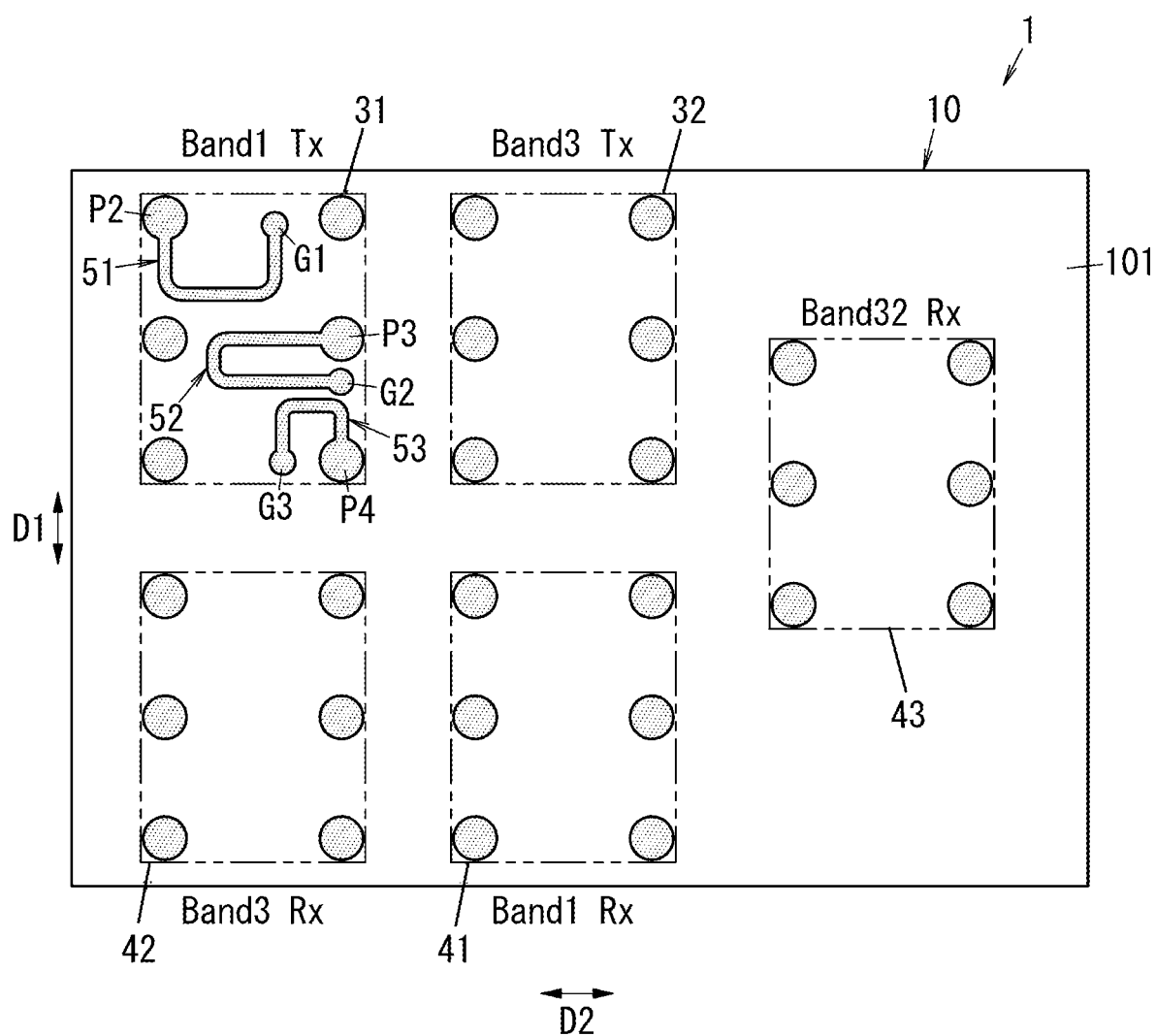
FIG. 1 is a plan view of a multiplexer according to an embodiment.

Hereafter, a multiplexer, a radio-frequency module, and a communication device according to embodiments will be described while referring to the drawings. The drawings referred to in the following embodiments and so forth are schematic drawings and the ratios between the sizes, thicknesses, and so forth of the individual constituent elements in the drawings do not necessarily reflect the actual dimensional ratios.

EMBODIMENT

1 Multiplexer

The overall configuration of a multiplexer 1 according to an embodiment will be described while referring to the drawings.

Figure 3:
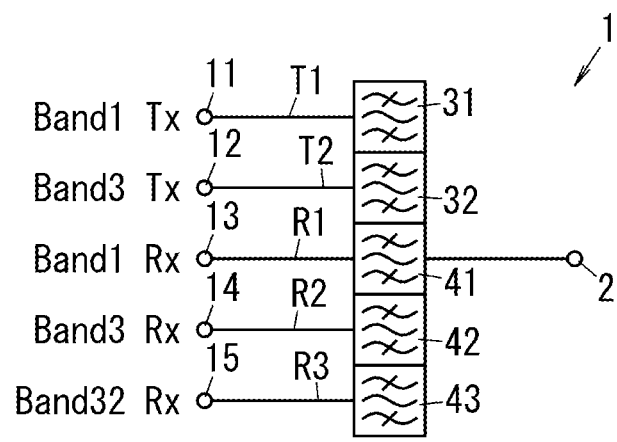
FIG. 3 is a schematic configuration diagram of the multiplexer.
Figure 4:
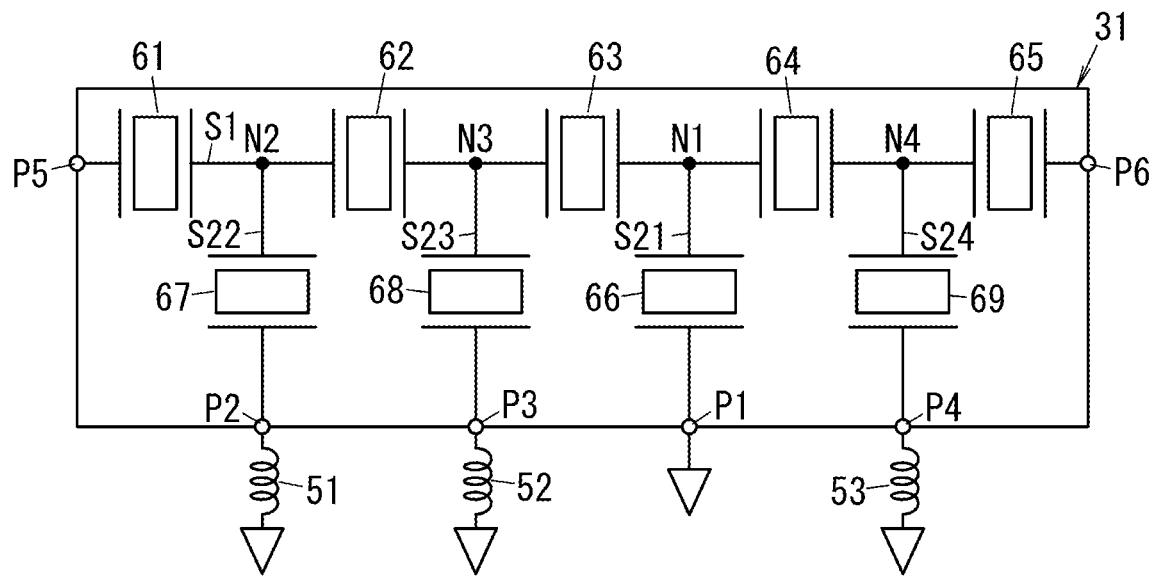
FIG. 4 is a circuit diagram of a transmission filter of the multiplexer.

As illustrated in FIG. 3, the multiplexer 1 according to this embodiment includes a common terminal 2, a first transmission filter 31 (first filter), a second transmission filter 32, a first reception filter 41, a second reception filter 42 (second filter), and a third reception filter 43 (third filter). In addition, the multiplexer 1 includes a first terminal 11, a second terminal 12, a third terminal 13, a fourth terminal 14, and a fifth terminal 15. As illustrated in FIG. 4, the multiplexer 1 further includes a first inductor 51, a second inductor 52, and a third inductor 53.

The multiplexer 1 supports simultaneous use of transmission in a first communication band and reception in a second communication band and simultaneous use of transmission in the first communication band and reception in a third communication band. The multiplexer 1 performs carrier aggregation in which a plurality of signals are simultaneously communicated. In more detail, the multiplexer 1 according to this embodiment can perform carrier aggregation of transmission signal of the first communication band and a reception signal of the second communication band and carrier aggregation of a transmission signal of the first communication band and a reception signal of the third communication band. The multiplexer 1 is not limited to performing carrier aggregation.

Figure 6:
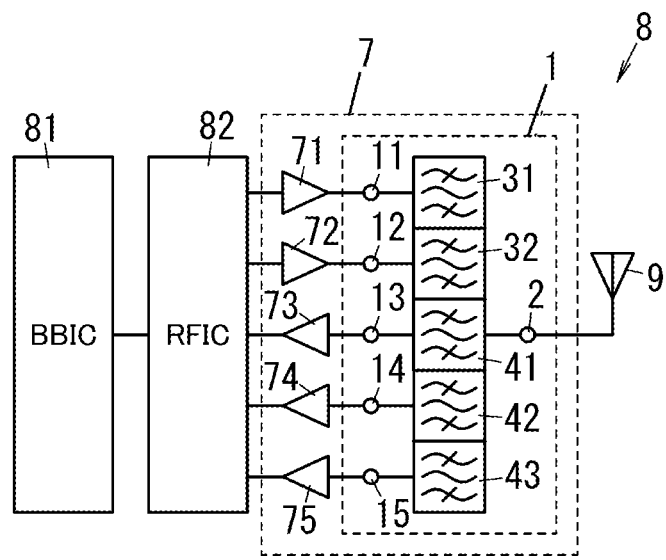
FIG. 6 is a schematic configuration diagram of a communication device according to an embodiment.

The multiplexer 1 is for example used in a mobile phone such as a smart phone. The multiplexer 1 is not limited to being used in a mobile phone and may instead be used in a wearable terminal such as a smart watch. In short, as illustrated in FIG. 6, the multiplexer 1 is used in a communication device 8 that performs communication with an external device (not illustrated).

2 Constituent Elements of Multiplexer

Hereafter, the constituent elements of the multiplexer 1 according to this embodiment will be described while referring to the drawings.

2.1 Common Terminal

The common terminal 2 illustrated in FIG. 3 is electrically connected to an antenna 9 (refer to FIG. 6). The common terminal 2 is not limited to being directly connected to the antenna 9 and may instead be indirectly connected to the antenna 9. In other words, a circuit or a circuit element such as a matching network may be inserted between the common terminal 2 and the antenna 9.

2.2 First Transmission Filter and First Reception Filter

As illustrated in FIG. 3, the first transmission filter 31 is provided on a first transmission path T1 that is for transmitting a first transmission signal to the antenna 9 (refer to FIG. 6). The first transmission path T1 is a path for transmitting the first transmission signal via the common terminal 2. The first transmission filter 31 allows the first transmission signal of the first communication band (first frequency band) to pass therethrough. The first communication band is Band 1 (transmission band: 1920 MHz-1980 MHz) of the Long Term Evolution (LTE) standard (including the LTE-Advanced standard), for example.

As described above, the first transmission filter 31 is a first filter that is provided on a first transfer path (first transmission path T1) that is for transferring a first communication signal (first transmission signal) of the first communication band via the common terminal 2, and that allows the first communication signal to pass therethrough. The first communication signal is a transmission signal of the Band 1 communication band.

As illustrated in FIG. 3, the first reception filter 41 is provided on a first reception path R1 that is for receiving a first reception signal from the antenna 9 (refer to FIG. 6). In other words, the first reception path R1 is a path for receiving the first reception signal via the common terminal 2. The first reception filter 41 allows the first reception signal of a first communication band (first frequency band) to pass therethrough. The first communication band of the first reception signal is different from the first communication band of the first transmission signal. The first communication band is Band 1 (reception band: 2110 MHz-2170 MHz) of the Long Term Evolution (LTE) standard (including the LTE-Advanced standard), for example.

2.3 Second Transmission Filter and Second Reception Filter

As illustrated in FIG. 3, the second transmission filter 32 is provided on a second transmission path T2 that is for transmitting a second transmission signal to the antenna 9 (refer to FIG. 6). The second transmission path T2 is a path for transmitting the second transmission signal via the common terminal 2. The second transmission filter 32 allows the second transmission signal of a second communication band (second frequency band) to pass therethrough. The second communication band is Band 3 (transmission band: 1710 MHz-1785 MHz) of the Long Term Evolution (LTE) standard (including the LTE-Advanced standard), for example.

As illustrated in FIG. 3, the second reception filter 42 is provided on a second reception path R2 that is for receiving a second reception signal from the antenna 9 (refer to FIG. 6). In other words, the second reception path R2 is a path for receiving the second reception signal via the common terminal 2. The second reception filter 42 allows the second reception signal of a second communication band (second frequency band) to pass therethrough. The second communication band of the second reception signal is different from the second communication band of the second transmission signal. The second communication band is Band 3 (reception band: 1805 MHz-1880 MHz) of the Long Term Evolution (LTE) standard (including the LTE-Advanced standard), for example.

As described above, the second reception filter 42 is a second filter that is provided on a second transfer path (second reception path R2) that is for transferring a second communication signal (second reception signal) of the second communication band, which is lower than the first communication band, via the common terminal 2, and that allows the second communication signal to pass therethrough. The second communication signal is a reception signal of the Band 3 communication band. An upper limit frequency of the first communication band is lower than a lower limit frequency of the first communication band.

2.4 Third Reception Filter

As illustrated in FIG. 3, the third reception filter 43 is provided on a third reception path R3 that is for receiving a third reception signal from the antenna 9 (refer to FIG. 6). The third reception path R3 is a path for transferring the third reception signal via the common terminal 2. The third reception filter 43 allows the third reception signal of a third communication band (third frequency band) to pass therethrough. The third communication band is Band 32 (reception band: 1452 MHz-1496 MHz) of the Long Term Evolution (LTE) standard (including the LTE-Advanced standard), for example.

As described above, the third reception filter 43 is a third filter that is provided on a third transfer path (third reception path R3) that is for transferring a third communication signal (third reception signal) of the third communication band, which is lower than the second communication band, via the common terminal 2, and that allows the third communication signal to pass therethrough. The third communication signal is a reception signal of the Band 32 communication band. An upper limit frequency of the third communication band is lower than a lower limit frequency of the second communication band.

2.5 First to Fifth Terminals

As illustrated in FIG. 3, the first terminal 11 is provided on the first transmission path T1 and is electrically connected to the first transmission filter 31. The first terminal 11 is electrically connected to a power amplifier 71 (refer to FIG. 6), which is described later. The second terminal 12 is provided on the second transmission path T2 and is electrically connected to the second transmission filter 32. The second terminal 12 is electrically connected to a power amplifier 72 (refer to FIG. 6), which is described later. The third terminal 13 is provided on the first reception path R1 and is electrically connected to the first reception filter 41. The third terminal 13 is electrically connected to a low noise amplifier (LNA) 73 (refer to FIG. 6), which is described later. The fourth terminal 14 is provided on the second reception path R2 and is electrically connected to the second reception filter 42. The fourth terminal 14 is electrically connected to a LNA 74 (refer to FIG. 6), which is described later. The fifth terminal 15 is provided on the third reception path R3 and is electrically connected to the third reception filter 43. The fifth terminal 15 is electrically connected to a LNA 75 (refer to FIG. 6), which is described later.

2.6 Detailed Configuration of First Transmission Filter

As illustrated in FIG. 4, the first transmission filter (first filter) is a ladder filter. The first transmission filter 31 includes a plurality (five in the illustrated example) of series arm resonators and a plurality (four in the illustrated example) of parallel arm resonators. In addition, the first transmission filter 31 has a first terminal P1, a second terminal P2, a third terminal P3, a fourth terminal P4, a fifth terminal P5, and a sixth terminal P6.

As illustrated in FIG. 4, the plurality of series arm resonators includes a first series arm resonator 61, a second series arm resonator 62, a third series arm resonator 63, a fourth series arm resonator 64, and a fifth series arm resonator 65. The plurality of series arm resonators are provided on a path S1 between the fifth terminal P5 and the sixth terminal P6. The plurality of series arm resonators are connected in series with each other along the path S1. The plurality of series arm resonators are arranged in the order of the first series arm resonator 61, the second series arm resonator 62, the third series arm resonator 63, the fourth series arm resonator 64, and the fifth series arm resonator 65 from the side near the common terminal 2.

As illustrated in FIG. 4, the plurality of parallel arm resonators includes a first parallel arm resonator 66, a second parallel arm resonator 67, a third parallel arm resonator 68, and a fourth parallel arm resonator 69.

The first parallel arm resonator 66 has a first resonant frequency. The first resonant frequency is lower than the first communication band. More specifically, the first resonant frequency is lower than the lower limit frequency of the first communication band. The first parallel arm resonator 66 is provided between the path S1 and ground. More specifically, the first parallel arm resonator 66 is provided on a first path S21 between a first node N1 on the path S1 and the first terminal P1. The first node N1 is located between the third series arm resonator 63 and the fourth series arm resonator 64 on the path S1. The first terminal P1 is electrically connected to ground. In other words, the electrical potential of the first terminal P1 is equal to the ground potential.

The second parallel arm resonator 67 has a second resonant frequency. The second resonant frequency is lower than the first resonant frequency and is included in the second communication band. The second parallel arm resonator 67 is provided between the path S1 and ground. More specifically, the second parallel arm resonator 67 is provided on a second path S22 between a second node N2 on the path S1 and the second terminal P2. The second node N2 is located between the first series arm resonator 61 and the second series arm resonator 62 on the path S1.

The third parallel arm resonator 68 has a third resonant frequency. The third resonant frequency is included in the third communication band. The third parallel arm resonator 68 is provided between the path S1 and ground. More specifically, the third parallel arm resonator 68 is provided on a third path S23 between a third node N3 on the path S1 and the third terminal P3. The third node N3 is located between the second series arm resonator 62 and the third series arm resonator 63 on the path S1.

The fourth parallel arm resonator 69 has a fourth resonant frequency. The fourth parallel arm resonator 69 is provided between the path S1 and ground. More specifically, the fourth parallel arm resonator 69 is provided on a fourth path S24 between a fourth node N4 on the path S1 and the fourth terminal P4. The fourth node N4 is located between the fourth series arm resonator 64 and the fifth series arm resonator 65 on the path S1.

2.7 First to Third Inductors

As illustrated in FIG. 4, the first inductor 51 is connected to the first transmission filter 31 (first filter). In more detail, the first inductor 51 is connected in series with the second parallel arm resonator 67 of the first transmission filter 31 between the second parallel arm resonator 67 and ground.

The second inductor 52 is connected to the first transmission filter 31 (first filter). In more detail, the second inductor 52 is connected in series with the third parallel arm resonator 68 of the first transmission filter 31 between the third parallel arm resonator 68 and ground.

The third inductor 53 is connected to the first transmission filter 31 (first filter). In more detail, the third inductor 53 is connected in series with the fourth parallel arm resonator 69 of the first transmission filter 31 between the fourth parallel arm resonator 69 and ground.

Here, as illustrated in FIG. 1, the multiplexer 1 further includes a substrate 10. The first inductor 51, the second inductor 52, and the third inductor 53 are provided in or on the substrate 10. In the example in FIG. 1, the first inductor 51, the second inductor 52, and the third inductor 53 are provided on a main surface 101 of the substrate 10. In addition, the first transmission filter 31, the second transmission filter 32, the first reception filter 41, the second reception filter 42, and the third reception filter 43 are arranged on the main surface 101 of the substrate 10.

Figure 2:
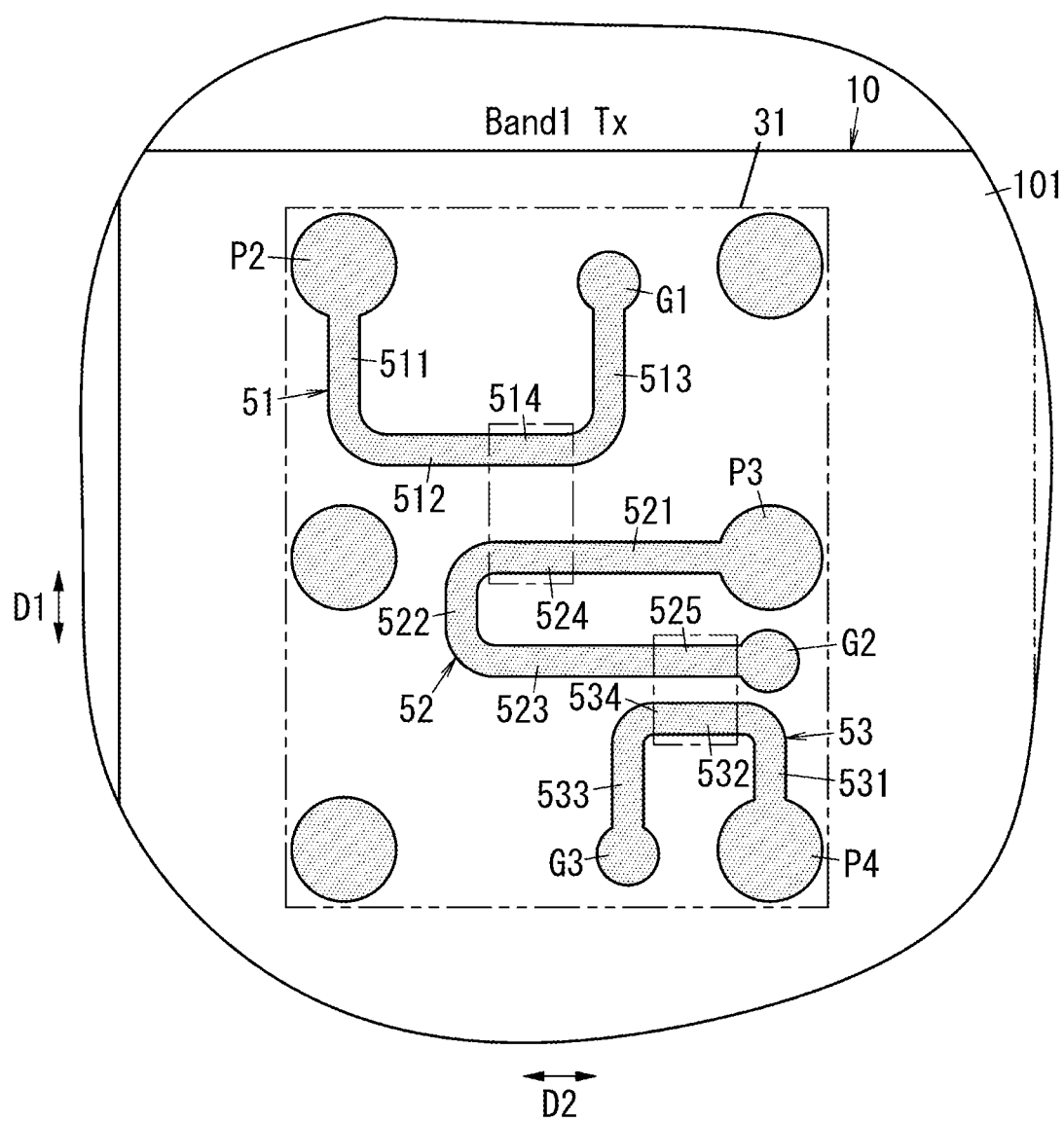
FIG. 2 is a plan view of main parts of the multiplexer.

As illustrated in FIG. 2, the first inductor 51 is provided on the main surface 101 of the substrate 10. One end of the first inductor 51 is connected to the second terminal P2. The other end of the first inductor 51 is connected to the first ground terminal G1. The first ground terminal G1 is directly or indirectly connected to ground.

The first inductor 51 has a plurality (three in the illustrated example) of conductor parts 511 to 513. The conductor part 511 is provided so as to extend along a first direction D1 and is connected to the second terminal P2. The conductor part 512 is provided so as to extend along a second direction D2 and is connected to the conductor part 511. The conductor part 513 is provided so as to extend along the first direction D1 and is connected to the conductor part 512 and the first ground terminal G1. The plurality of conductor parts 511 to 513 are provided so as to be integrated with each other. In addition, the first inductor 51 is provided so as to be integrated with the second terminal P2 and the first ground terminal G1.

The first inductor 51 is provided so as to extend around an axis that extends in a direction normal to the main surface 101 of the substrate 10. The first inductor 51 may be wound through one or more turns or may be wound through less than one turn. In addition, the first inductor 51 may be provided not only on the main surface 101 of the substrate 10 and may instead be provided so as to be divided between the main surface 101 and an inner layer surface of the substrate 10.

As illustrated in FIG. 2, the second inductor 52 is provided on the main surface 101 of the substrate 10. One end of the second inductor 52 is connected to the third terminal P3. The other end of the second inductor 52 is connected to the second ground terminal G2. The second ground terminal G2 is directly or indirectly connected to ground.

The second inductor 52 has a plurality (three in the illustrated example) of conductor parts 521 to 523. The conductor part 521 is provided so as to extend along the second direction D2 and is connected to the third terminal P3. The conductor part 522 is provided so as to extend along the first direction D1 and is connected to the conductor part 521. The conductor part 523 is provided so as to extend along the second direction D2 and is connected to the conductor part 522 and the second ground terminal G2. The plurality of conductor parts 521 to 523 are provided so as to be integrated with each other. In addition, the second inductor 52 is provided so as to be integrated with the third terminal P3 and the second ground terminal G2.

The second inductor 52 is provided so as to extend around an axis that extends in a direction normal to the main surface 101 of the substrate 10. The second inductor 52 may be wound through one or more turns or may be wound through less than one turn. In addition, the second inductor 52 may be provided not only on the main surface 101 of the substrate 10 and may instead be provided so as to be provided in a divided manner between the main surface 101 and an inner layer surface of the substrate 10.

As illustrated in FIG. 2, the third inductor 53 is provided on the main surface 101 of the substrate 10. One end of the third inductor 53 is connected to the fourth terminal P4. The other end of the third inductor 53 is connected to the third ground terminal G3. The third ground terminal G3 is directly or indirectly connected to ground.

The third inductor 53 has a plurality (three in the illustrated example) of conductor parts 531 to 533. The conductor part 531 is provided so as to extend along the first direction D1 and is connected to the fourth terminal P4. The conductor part 532 is provided so as to extend along the second direction D2 and is connected to the conductor part 531. The conductor part 533 is provided so as to extend along the first direction D1 and is connected to the conductor part 532 and the third ground terminal G3. The plurality of conductor parts 531 to 533 are provided so as to be integrated with each other. In addition, the third inductor 53 is provided so as to be integrated with the fourth terminal P4 and the third ground terminal G3.

The third inductor 53 is provided so as to extend around an axis that extends in a direction normal to the main surface 101 of the substrate 10. The third inductor 53 may be wound through one or more turns or may be wound through less than one turn. In addition, the third inductor 53 may be provided not only on the main surface 101 of the substrate 10 and may instead be provided in a divided manner between the main surface 101 and an inner layer surface of the substrate 10.

As illustrated in FIG. 2, the first inductor 51 and the second inductor 52 have the same winding direction from the first transmission filter 31 (first filter) side toward the ground side thereof. In more detail, the winding direction of the first inductor 51 from the second terminal P2 to the first ground terminal G1 and the winding direction of the second inductor 52 from the third terminal P3 to the second ground terminal G2 are identical. In FIG. 2, the winding direction of the first inductor 51 and the winding direction of the second inductor 52 are both anti-clockwise directions.

As described above, attenuation can be performed in Band 3 (second communication band) and Band 32 (third communication band) in the first transmission filter 31 (first filter) that allows the first transmission signal (first communication signal) of Band 1 (first communication band) to pass therethrough even in the case where the first transmission signal (first communication signal) and the first reception signal (second communication signal) are to be simultaneously transferred and in the case where the first transmission signal (first communication signal) and the second reception signal (third communication signal) are to be simultaneously transferred.

As illustrated in FIG. 2, the third inductor 53 has the same winding direction as the first inductor 51 and the second inductor 52 from the first transmission filter 31 (first filter) side toward the ground side thereof. In more detail, the winding direction of the third inductor 53 from the fourth terminal P4 to the third ground terminal G3 is identical to the winding direction of the first inductor 51 from the second terminal P2 to the first ground terminal G1 and the winding direction of the second inductor 52 from the third terminal P3 to the second ground terminal G2. In FIG. 2, the winding direction of the third inductor 53 is an anticlockwise direction and is identical to the winding direction of the first inductor 51 and the winding direction of the second inductor 52.

As illustrated in FIG. 2, the first inductor 51 and the second inductor 52 face each other at the parts thereof where the distance therebetween is smallest. "Parts at which the distance therebetween is smallest" refers to the parts of the first inductor 51 and the second inductor 52 where the distance therebetween is smallest in three dimensions. In the case where the first inductor 51 and the second inductor 52 are disposed on the same surface as in the example in FIG. 2, the parts of the first inductor 51 and the second inductor 52 where the distance therebetween is smallest are the parts at which the distance therebetween is smallest on that surface.

In addition, "face each other at the parts thereof where the distance therebetween is smallest" means face each other in a state where the parts at which the distance therebetween is smallest are close to each other. "Face each other at parts thereof where the distance therebetween is smallest" means that the parts face each other without necessarily a conductor other than the first inductor 51 and the second inductor 52 interposed between the parts.

Furthermore, the parts of the first inductor 51 and the second inductor 52 that face each other are substantially parallel to each other. In more detail, a facing part 514 of the first inductor 51 that faces the second inductor 52 and a facing part 524 of the second inductor 52 that faces the first inductor 51 are substantially parallel to each other. Here, the meaning of "the facing part 514 and the facing part 524 are substantially parallel to each other" includes a case where the facing part 514 and the facing part 524 are perfectly parallel to each other and a case where an angle formed between the facing part 514 and the facing part 524 is less than or equal to 10°. "An angle formed between the facing part 514 and the facing part 524" refers to an angle formed between a line segment extending along a length direction of the facing part 514 and a line segment extending along a length direction of the facing part 524. "The length direction of the facing part 514" is a direction that is perpendicular to a width direction of the facing part 514. "The length direction of the facing part 524" is a direction that is perpendicular to a width direction of the facing part 524.

In this embodiment, the facing parts 514 and 524 of the first inductor 51 and the second inductor 52 are provided on the same layer of the substrate 10. That is, the facing parts 514 and 524 are provided on the main surface 101 of the substrate 10.

A direction from the first transmission filter 31 (first filter) side toward the ground in the facing part 514 of the first inductor 51 and a direction from the first transmission filter 31 side toward the ground in the facing part 524 of the second inductor 52 are opposite directions. In other words, a direction from the second terminal P2 toward the first ground terminal G1 in the facing part 514 (rightward direction in FIG. 2) and a direction from the third terminal P3 toward the second ground terminal G2 in the facing part 524 (leftward direction in FIG. 2) are opposite directions with respective to the second direction D2.

In addition, as illustrated in FIG. 2, the second inductor 52 and the third inductor 53 face each other at the parts thereof where the distance therebetween is smallest. "Parts of the second inductor 52 and the third inductor 53 where the distance therebetween is smallest" refers to the parts of the second inductor 52 and the third inductor 53 where the distance therebetween is smallest in three dimensions. In the case where the second inductor 52 and the third inductor 53 are disposed on the same surface (main surface 101) as in the example in FIG. 2, the parts of the second inductor 52 and the third inductor 53 where the distance therebetween is smallest are the parts where the distance therebetween is smallest on that surface.

Furthermore, the parts of the second inductor 52 and the third inductor 53 that face each other are substantially parallel to each other. In more detail, a facing part 525 of the second inductor 52 that faces the third inductor 53 and a facing part 534 of the third inductor 53 that faces the second inductor 52 are substantially parallel to each other. Here, the meaning of "the facing part 525 and the facing part 534 are substantially parallel to each other" includes a case where the facing part 525 and the facing part 534 are perfectly parallel to each other and a case where an angle formed between the facing part 525 and the facing part 534 is less than or equal to 10°. "An angle formed between the facing part 525 and the facing part 534" refers to an angle formed between a line segment extending along a length direction of the facing part 525 and a line segment extending along a length direction of the facing part 534. "The length direction of the facing part 525" is a direction that is perpendicular to a width direction of the facing part 525. "The length direction of the facing part 534" is a direction that is perpendicular to a width direction of the facing part 534.

In this embodiment, the facing parts 525 and 534 of the second inductor 52 and the third inductor 53 are provided on the same layer of the substrate 10. That is, the facing parts 525 and 534 are provided on the main surface 101 of the substrate 10.

A direction from the first transmission filter 31 (first filter) side toward the ground in the facing part 525 of the second inductor 52 and a direction from the first transmission filter 31 side toward the ground in the facing part 534 of the third inductor 53 are opposite directions. In other words, a direction from the third terminal P3 toward the second ground terminal G2 in the facing part 525 (rightward direction in FIG. 2) and a direction from the fourth terminal P4 toward the third ground terminal G3 in the facing part 534 (leftward direction in FIG. 2) are opposite directions with respective to the second direction D2.

3 Multiplexer Characteristics

Figure 5:
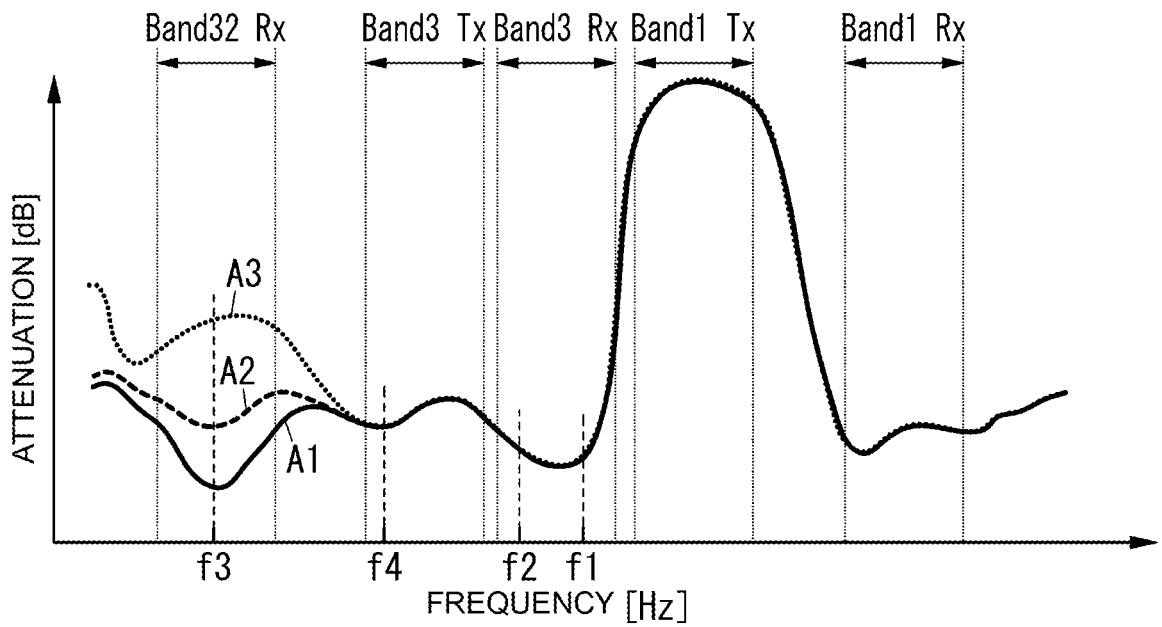
FIG. 5 is a graph illustrating a filter characteristic of the transmission filter of the multiplexer.

Hereafter, the characteristics of the first transmission filter 31 of the multiplexer 1 will be described while referring to FIG. 5. In FIG. 5, a characteristic A1 is a filter characteristic of the first transmission filter 31 of this embodiment. In addition to illustrating the characteristic A1, FIG. 5 also illustrates a characteristic A2 and a characteristic A3 as comparative examples. The characteristic A2 is a filter characteristic for a case in which the winding directions of the first inductor and the second inductor are different from each other. The characteristic A3 is a filter characteristic for a case in which the first inductor and the second inductor are not provided.

Attenuation at a first frequency f1 that is close to a Band 1 Tx communication band (Band 1 transmission band) is realized by the first parallel arm resonator 66. Attenuation at a second frequency f2 included in a Band 3 Rx communication band (Band 3 reception band) is realized by the second parallel arm resonator 67 and the first inductor 51. Attenuation at a fourth frequency f4 included in a Band 3 Tx communication band (Band 3 transmission band) is realized by the fourth parallel arm resonator 69 and the third inductor 53.

Attenuation at a third frequency f3 included in a Band 32 Rx communication band (Band 32 reception band) is realized by the third parallel arm resonator 68 and the second inductor 52. Here, in the case where the winding direction of the first inductor 51 and the winding direction of the second inductor 52 are identical, it is difficult for the first inductor 51 and the second inductor 52 to magnetically couple with each other, and therefore attenuation can be increased. On the other hand, in the case where the first inductor 51 and the second inductor 52 are not provided, attenuation is small as in the characteristic A3, and therefore a sufficient attenuation effect is not obtained. Furthermore, also in the case where the winding direction of the first inductor 51 and the winding direction of the second inductor 52 are different from each other, the first inductor 51 and the second inductor 52 magnetically couple with each other and therefore attenuation is insufficient as in the characteristic A2.

In the case where the winding direction of the first inductor 51 and the winding direction of the second inductor 52 are identical as described above, attenuation can be realized in the Band 32 Rx communication band, which is spaced apart from the Band 1 Tx communication band.

In particular, in the case of carrier aggregation of a Band 1 transmission signal and a Band 3 reception signal as in this embodiment, attenuation can be realized in the Band 3 reception band by the Band 1 first transmission filter 31. Similarly, in the case of carrier aggregation of a Band 1 transmission signal and a Band 32 reception signal as well, attenuation can be realized in the Band 32 reception band by the Band 1 first transmission filter 31. In other words, attenuation of bands outside the communication band can be realized in carrier aggregation where a plurality of signals are simultaneously communicated.

4 Radio-Frequency Module

As illustrated in FIG. 6, a radio-frequency module 7 includes the multiplexer 1, a plurality (two in the illustrated example) of power amplifiers 71 and 72, and a plurality (three in the illustrated example) of low noise amplifiers (LNA) 73 to 75. The power amplifier 71 is a first amplifier that is connected to the first transmission filter (first filter). The power amplifier 72 is an amplifier that is connected to the second transmission filter 32. The LNA 73 is connected to the first reception filter 41. The LNA 74 is a second amplifier that is connected to the second reception filter 42 (second filter). The LNA 75 is a third amplifier that is connected to the third reception filter 43 (third filter).

5 Communication Device

As illustrated in FIG. 6, a communication device 8 includes the radio-frequency module 7, a baseband signal processing circuit 81, and an RF signal processing circuit 82. A signal processing circuit that processes the first transmission signal, the second transmission signal, the first reception signal, the second reception signal, and the third reception signal is formed by the baseband signal processing circuit 81 and the RF signal processing circuit 82.

5.1 Baseband Signal Processing Circuit

As illustrated in FIG. 6, the baseband signal processing circuit 81 is for example a baseband integrated circuit (BBIC) and is electrically connected to the RF signal processing circuit 82. The baseband signal processing circuit 81 generates an I phase signal and a Q phase signal from a baseband signal. The baseband signal processing circuit 81 performs IQ modulation processing by combining the I phase signal and the Q phase signal, and outputs the first transmission signal and the second transmission signal. At this time, the first transmission signal and the second transmission signal are generated as modulated signals by performing amplitude modulation on a carrier signal of a prescribed frequency using a longer period than the period of the carrier signal.

5.2 RF Signal Processing Circuit

As illustrated in FIG. 6, the RF signal processing circuit 82 is for example a radio-frequency integrated circuit (RFIC) and is provided between the radio-frequency module 7 and the baseband signal processing circuit 81. The RF signal processing circuit 82 has a function of performing signal processing on the first transmission signal and the second transmission signal from the baseband signal processing circuit 81 and a function of performing signal processing on the first reception signal, the second reception signal, and the third reception signal received via the antenna 9. The RF signal processing circuit 82 is a processing circuit that supports multiple bands and is able to generate and amplify transmission signals of a plurality of communication bands (first transmission signal and second transmission signal).

6 Effects

The multiplexer 1 according to this embodiment includes the first inductor 51 that is connected in series with the second parallel arm resonator 67 of the first transmission filter 31 (first filter) and the second inductor 52 that is connected in series with the third parallel arm resonator 68 of the first transmission filter 31. In addition, the first inductor 51 and the second inductor 52 have the same winding direction as each other from the first transmission filter 31 side toward the ground side thereof. Thus, attenuation can be performed in Band 3 (second communication band) and Band 32 (third communication band) in the first transmission filter 31, which allows the first transmission signal (first communication signal) of Band 1 (first communication band) to pass therethrough.

7 Modifications

Hereafter, modifications of this embodiment will be described.

The facing parts 514 and 524 of the first inductor 51 and the second inductor 52 may be provided on different layers from each other in the substrate 10. In this case, the substrate 10 would be a multilayer substrate formed of a plurality of layers.

The above-described embodiment focused on the first transmission filter 31 that allows the first transmission signal of Band 1 to pass therethrough, but a modification of the embodiment focusing on a first reception filter 41 that allows the first reception signal of Band 1 to pass therethrough may also be considered.

In this modification, the first reception filter 41 is a ladder filter. The first reception filter 41 includes a plurality of series arm resonators and a plurality of parallel arm resonators similarly to the first transmission filter 31 of the above-described embodiment. In addition, the first reception filter 41 has a first terminal P1, a second terminal P2, a third terminal P3, a fourth terminal P4, a fifth terminal P5, and a sixth terminal P6.

Figure 7:
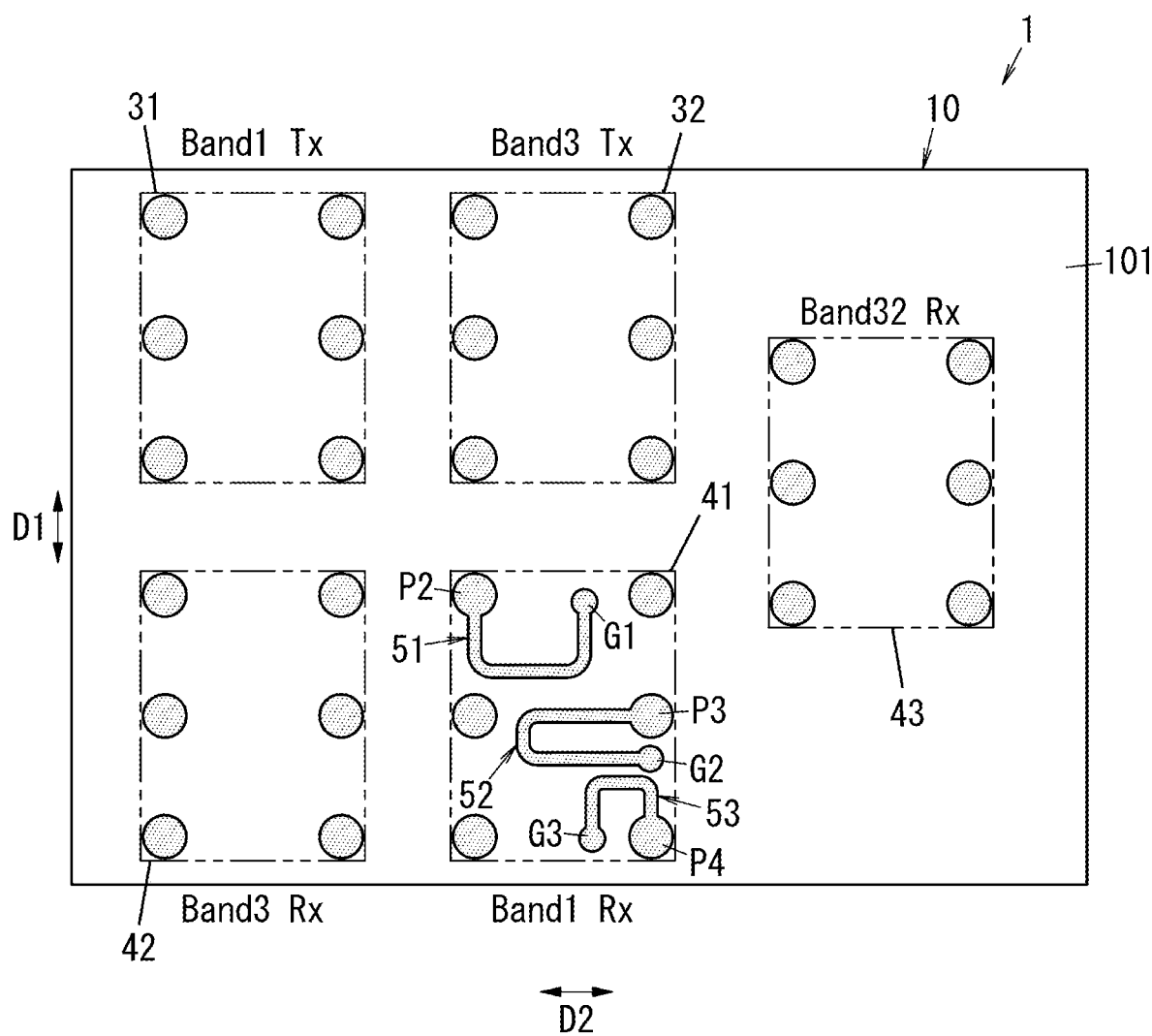
FIG. 7 is a plan view of a multiplexer according to a modification of the embodiment.

The first inductor 51 illustrated in FIG. 7 is connected to the first reception filter 41 (first filter). In more detail, the first inductor 51 is connected in series with the second parallel arm resonator 67 of the first reception filter 41 between the second parallel arm resonator 67 and ground.

The second inductor 52 illustrated in FIG. 7 is connected to the first reception filter 41 (first filter). In more detail, the second inductor 52 is connected in series with the third parallel arm resonator 68 of the first reception filter 41 between the third parallel arm resonator 68 and ground.

The third inductor 53 illustrated in FIG. 7 is connected to the first reception filter 41 (first filter). In more detail, the third inductor 53 is connected in series with the fourth parallel arm resonator 69 of the first reception filter 41 between the fourth parallel arm resonator 69 and ground.

One end of the first inductor 51 is connected to the second terminal P2. The other end of the first inductor 51 is connected to the first ground terminal G1. The first ground terminal G1 is directly or indirectly connected to ground. The first inductor 51 has a plurality (three in the illustrated example) of conductor parts 511 to 513.

One end of the second inductor 52 is connected to the third terminal P3. The other end of the second inductor 52 is connected to the second ground terminal G2. The second ground terminal G2 is directly or indirectly connected to ground. The second inductor 52 has a plurality (three in the illustrated example) of conductor parts 521 to 523.

One end of the third inductor 53 is connected to the fourth terminal P4. The other end of the third inductor 53 is connected to the third ground terminal G3. The third ground terminal G3 is directly or indirectly connected to ground. The third inductor 53 has a plurality (three in the illustrated example) of conductor parts 531 to 533.

Figure 8:
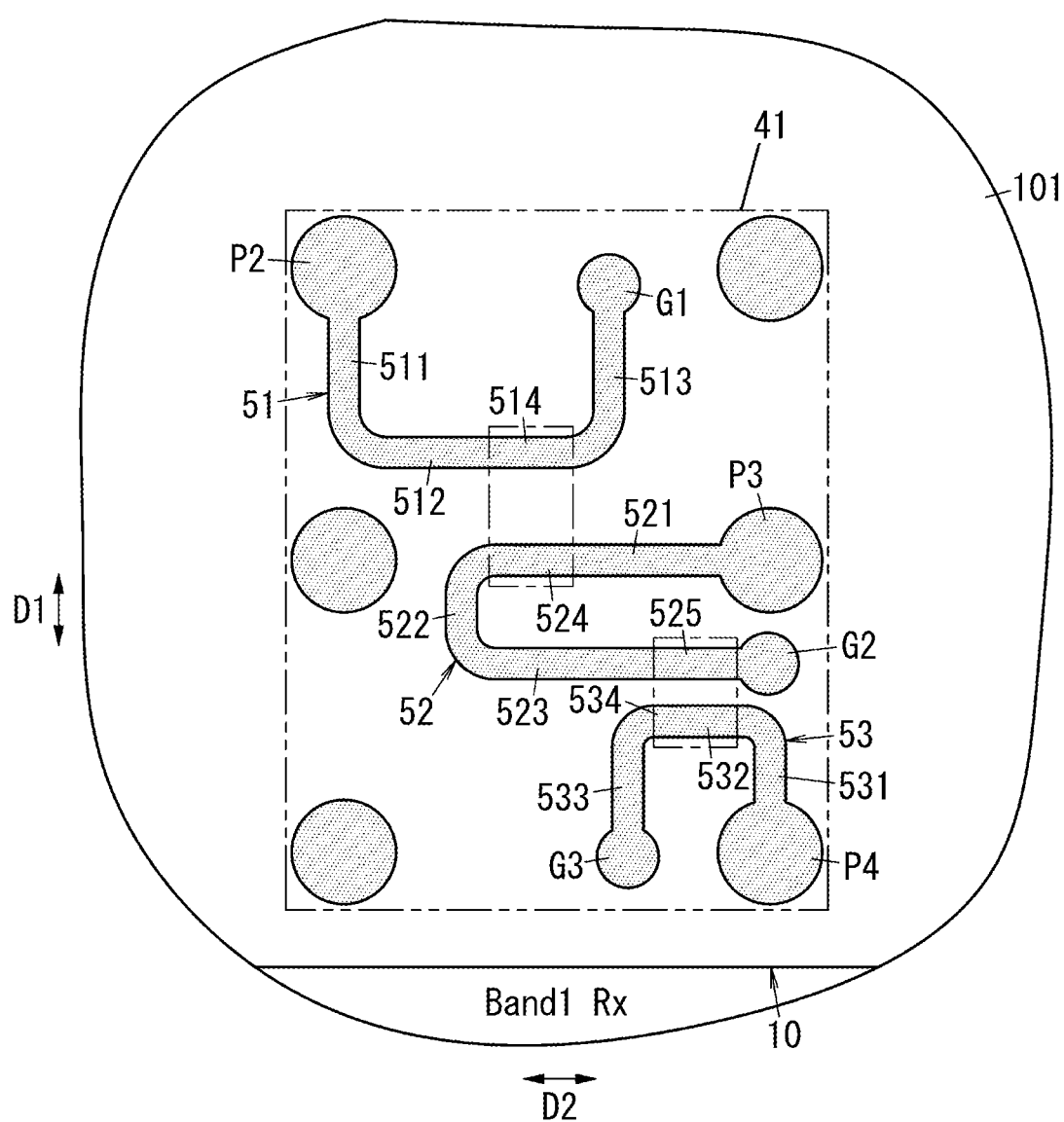
FIG. 8 is a plan view of main parts of the multiplexer.

In this modification as well, as illustrated in FIG. 8, the first inductor 51 and the second inductor 52 have the same winding directions as each other from the first reception filter 41 (first filter) side toward the ground side thereof, similarly to as in the embodiment. In more detail, the winding direction of the first inductor 51 from the second terminal P2 to the first ground terminal G1 and the winding direction of the second inductor 52 from the third terminal P3 to the second ground terminal G2 are identical. In FIG. 8, the winding direction of the first inductor 51 and the winding direction of the second inductor 52 are both anticlockwise directions.

As described above, attenuation can be performed in a transmission frequency band of Band 1 (second communication band) and a transmission frequency band of Band 3 (third communication band) in the first reception filter 41 (first filter), which allows the first reception signal (first communication signal) of Band 1 (first communication band) to pass therethrough.

In this modification as well, as illustrated in FIG. 8, the winding direction of the third inductor 53 is the same as that of the first inductor 51 and the second inductor 52 from the first reception filter 41 (first filter) side toward the ground side thereof, similarly to as in the embodiment. In more detail, the winding direction of the third inductor 53 from the fourth terminal P4 to the third ground terminal G3 is identical to the winding direction of the first inductor 51 from the second terminal P2 to the first ground terminal G1 and the winding direction of the second inductor 52 from the third terminal P3 to the second ground terminal G2. In FIG. 8, the winding direction of the third inductor 53 is an anticlockwise direction and is identical to the winding direction of the first inductor 51 and the winding direction of the second inductor 52.

In addition, in this modification as well, similarly to as in the embodiment, the first inductor 51 and the second inductor 52 face each other at the parts thereof where the distance therebetween is smallest, as illustrated in FIG. 8. Furthermore, the parts of the first inductor 51 and the second inductor 52 that face each other are substantially parallel to each other. In more detail, a facing part 514 of the first inductor 51 that faces the second inductor 52 and a facing part 524 of the second inductor 52 that faces the first inductor 51 are substantially parallel to each other.

In addition, in this modification as well, similarly to as in the embodiment, the second inductor 52 and the third inductor 53 face each other at the parts thereof where the distance therebetween is smallest, as illustrated in FIG. 8. Furthermore, the parts of the second inductor 52 and the third inductor 53 that face each other are substantially parallel to each other. In more detail, a facing part 525 of the second inductor 52 that faces the third inductor 53 and a facing part 534 of the third inductor 53 that faces the second inductor 52 are substantially parallel to each other.

Figure 9:
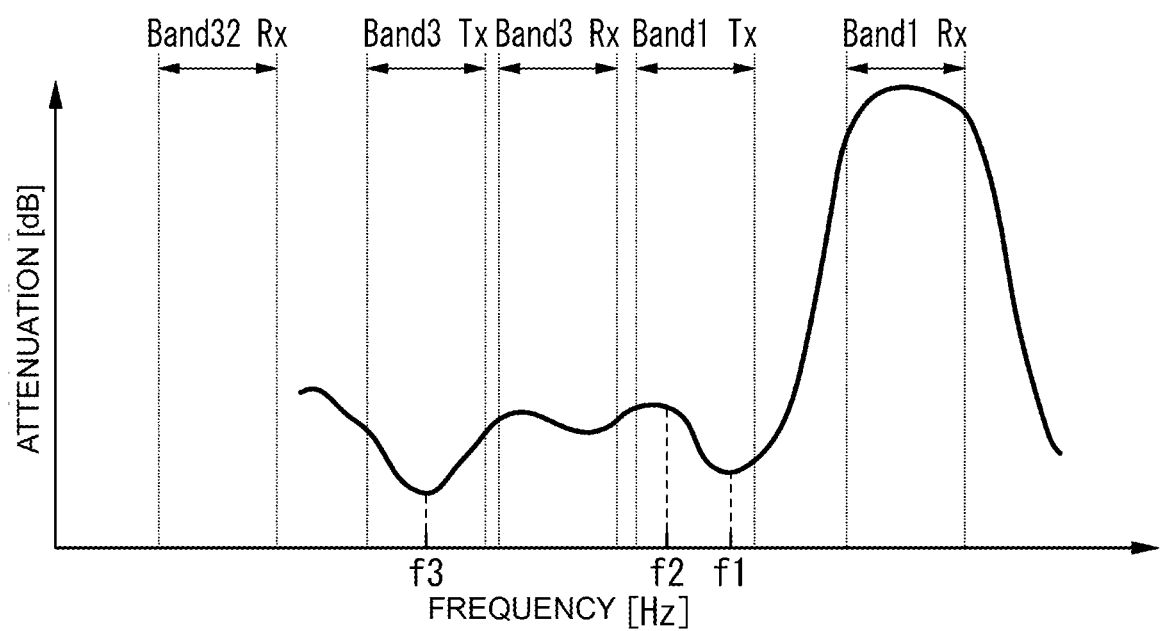
FIG. 9 is a graph illustrating a filter characteristic of a transmission filter of the multiplexer.

Next, the characteristics of the first reception filter 41 in the multiplexer 1 according to this modification will be described while referring to FIG. 9.

Attenuation at a first frequency f1 that is close to a Band 1 Rx communication band (Band 1 reception band) is realized by the first parallel arm resonator 66. Attenuation at a second frequency f2 included in a Band 1 Tx communication band (Band 1 transmission band) is realized by the second parallel arm resonator 67 and the first inductor 51.

Attenuation at a third frequency f3 included in the Band 3 Tx communication band is realized by the third parallel arm resonator 68 and the second inductor 52. Here, in the case where the winding direction of the first inductor 51 and the winding direction of the second inductor 52 are identical, it is difficult for the first inductor 51 and the second inductor 52 to magnetically couple with each other, and therefore attenuation can be increased. On the other hand, in the case where the first inductor 51 and the second inductor 52 are not provided, attenuation is small, and therefore a sufficient attenuation effect is not obtained. Furthermore, also in the case where the winding direction of the first inductor 51 and the winding direction of the second inductor 52 are different from each other, the first inductor 51 and the second inductor 52 magnetically couple with each other and therefore attenuation is insufficient.

In the case where the winding direction of the first inductor 51 and the winding direction of the second inductor 52 are identical as described above, attenuation can be realized in the Band 3 Tx communication band, which is spaced apart from the Band 1 Rx communication band.

The multiplexer 1 according to the embodiment can also be applied to a combination of Band 1, Band 3, and Band 40 (2300 MHz-2400 MHz) and a combination of Band 1, Band 3, and Band (2496 MHz-2690 MHz) in addition to the combination of Band 1, Band 3, and Band 32. Furthermore, the multiplexer 1 can also be applied to a combination of Band 25 (transmission band: 1850 MHz-1915 MHz, reception band: 1930 MHz-1995 MHz) and Band 66 (transmission band: 1710 MHz-1780 MHz, reception band: 2110 MHz-2200 MHz), a combination of Band 25, Band 66, and Band 7 (transmission band: 2500 MHz-2570 MHz, reception band: 2620 MHz-2690 MHz), a combination of Band 25, Band 66, and Band 40, a combination of Band 25, Band 66, and Band 41, and a combination of Band 25, Band 66, and Band 30 (transmission band: 2305 MHz-2315 MHz, reception band: 2350 MHz-2360 MHz).

In addition, the multiplexer 1 according to this embodiment has a configuration in which a plurality of filters are connected to the common terminal 2 via a common connection (bundled together) as illustrated in FIG. 3, but the embodiment is not limited to this configuration. As a modification of this embodiment, for example, the multiplexer 1 may further include a switch that selects at least one of the plurality of filters and connects the selected at least one filter to the common terminal 2 (so-called direct mapping switch).

In the multiplexer 1 according to each of the above-described modifications, the same effect is achieved as in the multiplexer 1 according to the above-described embodiment.

The above-described embodiment and modifications are merely some examples of various embodiments and modifications of the present disclosure. The embodiments and modifications can be changed in various ways in accordance with the design and so forth.

Modes

The following modes are disclosed based on the above-described embodiment and modifications.

A multiplexer (1) according to a first mode includes: a common terminal (2); a first filter (first transmission filter 31 or first reception filter 41); a second filter (second reception filter 42 or first transmission filter 31); a third filter (third reception filter 43 or second transmission filter 32); a first inductor (51); and a second inductor (52). The first filter is a filter that can be electrically connected to the common terminal (2) and allows a first communication signal (first transmission signal or first reception signal) of a first communication band (Band 1 Tx or Band 1 Rx) to pass therethrough. The first filter is a ladder filter that includes a plurality of parallel arm resonators. The second filter can be electrically connected to the common terminal (2) and allows a second communication signal (second reception signal or first transmission signal) of a second communication band (Band 3 Rx, Band 1 Tx) that is lower than the first communication band to pass therethrough. The third filter can be electrically connected to the common terminal (2) and allows a third communication signal (third reception signal or second transmission signal) of a third communication band (Band 32 Rx or Band 3 Tx) that is lower than the second communication band to pass therethrough. The first inductor (51) is connected in series with one parallel arm resonator (second parallel arm resonator 67), among the plurality of parallel arm resonators of the first filter, between the parallel arm resonator and ground. The second inductor (52) is connected in series with another parallel arm resonator (third parallel arm resonator 68), among the plurality of parallel arm resonators of the first filter, between the other parallel arm resonator and ground. The first inductor (51) and the second inductor (52) have the same winding direction as each other from the first transmission filter side the ground side thereof.

With the multiplexer (1) according to the first mode, attenuation can be performed in the second communication band (Band 3 Rx or Band 1 Tx) and the third communication band (Band 32 Rx or Band 3 Tx) in the first filter (first transmission filter 31 or first reception filter 41) that allows the first communication signal (first transmission signal or first reception signal) of the first communication band (band 1 Tx or Band 1 Rx) to pass therethrough.

In a multiplexer (1) according to a second mode, with respect to the first mode, the plurality of parallel arm resonators includes a first parallel arm resonator (66), a second parallel arm resonator (67), and a third parallel arm resonator (68). The first parallel arm resonator (66) has a first resonant frequency. The first resonant frequency is lower than the first communication band (Band 1 Tx or Band 1 Rx). The second parallel arm resonator (67) is a parallel arm resonator that serves as the one parallel arm resonator. The second parallel arm resonator (67) has a second resonant frequency. The second resonant frequency is lower than the first resonant frequency and is included in the second communication band (Band 3 Rx or Band 1 Tx). The third parallel arm resonator (68) is a parallel arm resonator that serves as the other parallel arm resonator. The third parallel arm resonator (68) has a third resonant frequency. The third resonant frequency is included in the third communication band (Band 32 Rx or Band 3 Tx).

In a multiplexer (1) according to a third mode, with respect to the first or second mode, the first inductor (51) and the second inductor (52) face each other at parts thereof where the distance therebetween is smallest and the facing parts thereof (facing parts 514 and 524) are substantially parallel to each other.

A multiplexer (1) according to a fourth mode further includes a substrate (10) with respect to the third mode. The first inductor (51) and the second inductor (52) are provided on or in the substrate (10). The parts of the first inductor (51) and the second inductor (52) that face each other (facing parts 514 and 524) are provided on different layers from each other in the substrate (10).

A multiplexer (1) according to a fifth mode further includes a third inductor (53) with respect to the second mode. The third inductor (53) is connected to the first filter (first transmission filter 31 or first reception filter 41). The plurality of parallel arm resonators further includes a fourth parallel arm resonator (69). The fourth parallel arm resonator (69) has a fourth resonant frequency. In more detail, the third inductor (53) is connected in series with the fourth parallel arm resonator (69) of the first filter between the fourth parallel arm resonator (69) and ground. The third inductor (53) has the same winding direction from the first transmission filter side toward the ground side thereof as the first inductor (51) and the second inductor (52).

In a multiplexer (1) according to a sixth mode, the first communication signal is a transmission signal of the Band 1 communication band with respect to any one of the first to fifth modes. The second communication signal is a reception signal of the Band 3 communication band. The third communication signal is a reception signal of the Band 32 communication band.

A radio-frequency module (7) according to a seventh mode includes: the multiplexer (1) according to any one of the first to sixth modes; a first amplifier (power amplifier 71); a second amplifier (LNA 74); and a third amplifier (LNA 75). The first amplifier is connected to the first filter (first transmission filter 31 or first reception filter 41). The second amplifier is connected to the second filter (second reception filter 42 or first transmission filter 31). The third filter is connected to the third filter (third reception filter 43 or second transmission filter 32).

A communication device (8) according to an eighth mode includes: the radio-frequency module (7) of the seventh mode; and a signal processing circuit (baseband signal processing circuit 81 and RF signal processing circuit 82). The signal processing circuit processes the first communication signal (first transmission signal or first reception signal), the second communication signal (second reception signal or first transmission signal), and the third communication signal (third reception signal or second transmission signal).

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A multiplexer comprising:
   a common terminal;
   a first filter configured to be selectively connected to the common terminal and to pass a first communication signal of a first communication band, the first filter being a ladder filter comprising a plurality of parallel arm resonators;
   a second filter configured to be selectively connected to the common terminal and to pass a second communication signal of a second communication band, the second communication band being lower than the first communication band;
   a third filter configured to be selectively connected to the common terminal and to pass a third communication signal of a third communication band, the third communication band being lower than the second communication band;
   a first inductor connected in series between a second of the parallel arm resonators and ground; and
   a second inductor connected in series between a third of the parallel arm resonators and ground,
   wherein the first inductor and the second inductor have the same winding direction from a first filter side to a ground side,
   wherein a first of the parallel arm resonators has a first resonant frequency that is lower than the first communication band, wherein the second of the parallel arm resonators has a second resonant frequency that is less than the first resonant frequency and that is in the second communication band, and wherein the third of the parallel arm resonators has a third resonant frequency that is in the third communication band.

2. The multiplexer according to claim 1, further comprising:
a third inductor connected to the first filter, wherein:
the plurality of parallel arm resonators further comprises a fourth parallel arm resonator having a fourth resonant frequency,
the third inductor is connected in series between the fourth parallel arm resonator and ground, and
the third inductor has the same winding direction as the first inductor and the second inductor from the first filter side to the ground side.

3. The multiplexer according to claim 1, wherein the first inductor and the second inductor are physically arranged such that, as seen in a plan view, wiring portions of the first inductor and the second inductor that are closest to each other are substantially parallel.

4. The multiplexer according to claim 3, further comprising:
a substrate on or in which the first inductor and the second inductor are provided,
wherein the wiring portions that are closest to each other are provided on or in different layers of the substrate.

5. The multiplexer according to claim 2, wherein the first inductor, the second inductor, and the third inductor are physically arranged such that, as seen in a plan view:
wiring portions of the first inductor and the second inductor that are closest to each other are substantially parallel, and
wiring portions of the second inductor and the third inductor that are closest to each other are substantially parallel.

6. The multiplexer according to claim 1, wherein the first inductor, the second inductor, and a third inductor that is connected to the first filter, are physically arranged such that, as seen in a plan view:
wiring portions of the first inductor and the second inductor that are closest to each other are substantially parallel, and
wiring portions of the second inductor and the third inductor that are closest to each other are substantially parallel.

7. The multiplexer according to claim 6, wherein the wiring portion of the first inductor that is closest to the second inductor, and the wiring portion of the third inductor that is closest to the second inductor, are substantially parallel.

8. The multiplexer according to claim 1, wherein:
the first communication signal is a transmission signal of a Band 1 communication band,
the second communication signal is a reception signal of a Band 3 communication band, and
the third communication signal is a reception signal of a Band 32 communication band.

9. A radio-frequency module comprising:
the multiplexer according to claim 1;
a first amplifier connected to the first filter;
a second amplifier connected to the second filter; and
a third amplifier connected to the third filter.

10. A communication device comprising:
the radio-frequency module according to claim 9; and
a signal processing circuit configured to process the first communication signal, the second communication signal, and the third communication signal.

11. The multiplexer according to claim 5, wherein the wiring portion of the first inductor that is closest to the second inductor, and the wiring portion of the third inductor that is closest to the second inductor, are substantially parallel.

* * * * *

UNITED STATES PATENT AND TRADEMARK OFFICE
CERTIFICATE OF CORRECTION

PATENT NO. : 11,228,301 B2
APPLICATION NO. : 16/817047
DATED : January 18, 2022
INVENTOR(S) : Kazuhiro Ikarashi et al.

It is certified that error appears in the above-identified patent and that said Letters Patent is hereby corrected as shown below:

In the Specification

Column 5, Line 30, "filter (first" should be -- filter 31 (first --.

Signed and Sealed this
Eighth Day of November, 2022

Katherine Kelly Vidal
*Director of the United States Patent and Trademark Office*